US007403368B2

(12) United States Patent
Johnson, Jr.

(10) Patent No.: US 7,403,368 B2
(45) Date of Patent: Jul. 22, 2008

(54) DEVICES AND METHODS FOR DETECTING OPERATIONAL FAILURES OF RELAYS

(75) Inventor: Robert W. Johnson, Jr., Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 469 days.

(21) Appl. No.: 10/861,620

(22) Filed: Jun. 4, 2004

(65) Prior Publication Data

US 2005/0270720 A1 Dec. 8, 2005

(51) Int. Cl.
*H01H 47/00* (2006.01)
(52) U.S. Cl. ...................... 361/157; 361/160
(58) Field of Classification Search ............. 361/160, 361/157
See application file for complete search history.

(56) References Cited

U.S. PATENT DOCUMENTS 5,241,217 A   8/1993  Severinsky 6,226,167 B1 *  5/2001  Chmiel .................. 361/160

FOREIGN PATENT DOCUMENTS

EP        0 558 190 A1     9/1993

OTHER PUBLICATIONS

International Preliminary Report on Patentability, PCT/IB2005/001566, Jun. 14, 2006.

* cited by examiner

*Primary Examiner*—Stephen W. Jackson
(74) *Attorney, Agent, or Firm*—Myers Bigel Sibley & Sajovec

(57) ABSTRACT

An uninterruptible power supply (UPS) includes a power conversion circuit and a relay. The relay is configured to couple and decouple a power source to and from an input of the power conversion circuit. The control circuit is operative to apply a coil current to the relay to sense the coil current and to detect an operational failure of the relay from the sensed coil current. Related methods of operating such UPSs are also provided.

13 Claims, 6 Drawing Sheets

Figure 1. Coil energized -- contacts held fixed [upper trace -- coil voltage, lower trace -- coil current]

Figure 2. Coil energized -- contacts free to move [upper trace -- coil voltage, lower trace -- coil current]

Figure 3, Coil de-energized with diode -- contacts held fixed [upper trace -- coil voltage, lower trace -- coil current]

Figure 4, Coil de-energized with diode -- contacts free to move [upper trace -- coil voltage, lower trace -- coil current]

Figure 5, Coil de-energized with resistor and diode -- contacts held fixed [upper trace -- coil voltage, lower trace -- coil current]

Figure 6, Coil de-energized with resistor and diode -- contacts free to move [upper trace -- coil voltage, lower trace -- coil current]

DEVICES AND METHODS FOR DETECTING OPERATIONAL FAILURES OF RELAYS

BACKGROUND OF THE INVENTION

The present invention relates to a power supply apparatus and methods of operation thereof, and more particularly, to uninterruptible power supplies (UPSs) and methods of operation thereof.

UPSs are commonly used to provide conditioned and/or auxiliary power to electronic equipment that provides critical functions, such as computer systems, telecommunications systems and medical equipment. Typically, UPSs can provide AC power from a backup source, such as a battery, generator or fuel cell, in the event that a utility power supply fails or becomes degraded.

UPSs may be coupled to and decoupled from one or more power sources using, for example, a relay. In particular, UPSs are often coupled to more than one source of power. For example, a UPS may have a primary source of power such as a utility, and a secondary source of power, such as battery or generator. The UPS may be coupled to the primary source of power and the secondary source of power using first and second relays, respectively. If one of the relays welds closed, the UPS may connect the sources together, which may damage the sources and/or interconnecting wiring.

Methods of determining a state of a relay have been developed to address this issue. For example, a light emitting diode (LED) may be placed across the relay contact to provide a visual indication as to whether the relay is open or closed. However, these types of sensors may not be reliable and may provide a false indication.

SUMMARY OF THE INVENTION

Some embodiments of the present invention provide an uninterruptible power supply (UPS) including a power conversion circuit and a relay. The relay is configured to couple and decouple a power source to and from an input of the power conversion circuit. The control circuit is operative to apply a coil current to the relay to sense the coil current and to detect an operational failure of the relay from the sensed coil current.

In further embodiments of the present invention, the control circuit may be further configured to monitor and analyze the coil current and detect a pattern indicative of the operational failure of the relay. In certain embodiments of the present invention, the pattern may include a change in the coil current with respect to time. The control circuit may be further configured to energize and/or de-energize the relay to flex the armature of the relay if an operational failure is detected.

Still further embodiments of the present invention provide a device including a relay. The relay includes a coil and an armature. The device further includes a control circuit that is configured to sense a current in the coil of the relay and to detect a pattern indicating a state of the armature of the relay from the sensed current.

Some embodiments of the present invention provide methods of determining a state of a relay. The methods include energizing the relay and sensing a coil current through a coil of the relay. A pattern is detected in the sensed coil current indicating an operational failure of an armature of the relay. The relay is energized and/or de-energized responsive to detection of the operational failure of the relay to flex the armature of the relay.

In further embodiments of the present invention, the relay may be configured to couple and decouple a power source to and from an input of a power conversion circuit of a UPS. The UPS may further include a current sensor configured to sense the coil current. The current sensor may be a resistance element and/or a Hall Effect current sensor Still further embodiments of the present invention provide methods of determining a state of a relay. The methods include monitoring a coil current through a coil associated with the relay. A pattern may be detected in the monitored coil current indicating an operational failure of an armature of the relay. The state of the armature may be determined from the detected pattern.

In some embodiments of the present invention, the state of the armature may be determined by detecting movement of the armature. The relay may be energized and/or de-energized to flex the armature of the relay if it is determined that the armature is fixed in a stationary position.

DETAILED DESCRIPTION OF EMBODIMENTS OF THE INVENTION

Figure 1A:
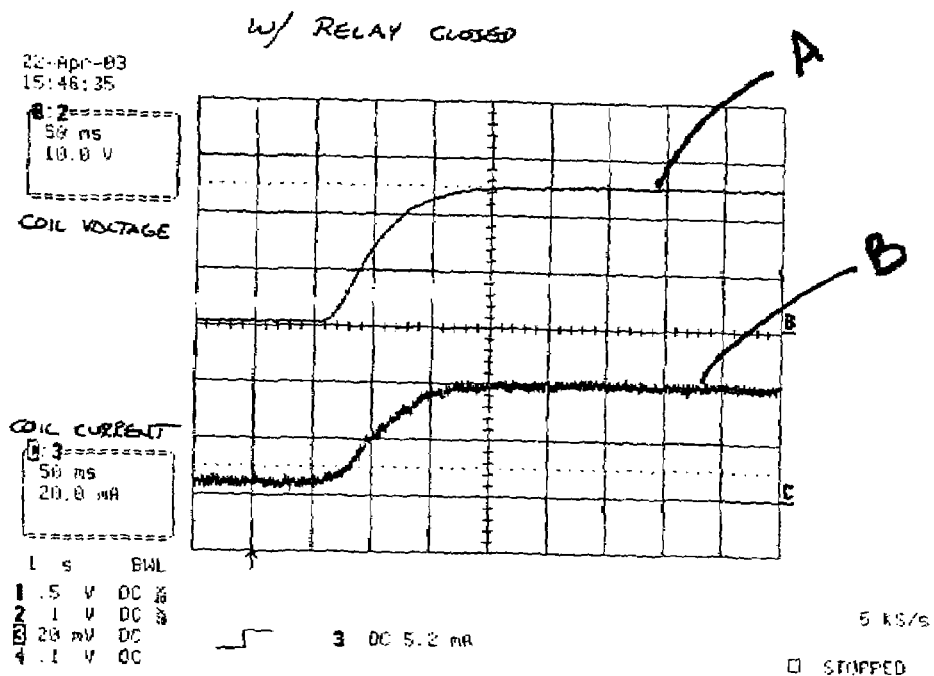
FIGS. 1A through 1F are waveform diagrams illustrating coil currents and voltages with a relay according to some embodiments of the present invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein the term "and/or" includes any and all combinations of one or more of the associated listed items.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention will now be described with respect to FIGS. 1A through 6. As discussed herein, embodiments of the present invention provide devices and methods for detecting an operational failure of a relay. In some embodiments of the present invention, a control circuit is provided that is configured to sense a current in a coil of a relay and detect a pattern indicating an operational failure of the relay. For example, the detected pattern may indicate that a contact of the relay is welded shut. In other words, contact welding may prevent an armature of the relay from moving from a first contact position to a second contact position. Accordingly, the armature of the relay may not move or change contact positions responsive to energizing and/or de-energizing the coil of the relay. If an operational failure is detected based on the pattern, the control circuit may be further configured to energize and/or de-energize the relay to flex the armature of the relay to break the weld. In some embodiments of the present invention, the control circuit may be included in an uninterruptible power supply (UPS). Accordingly, improved devices for detecting an operational failure of a relay may be provided as discussed further below.

Some embodiments of the present invention arise from the realization that a state of a relay may be detected by identifying a pattern in a coil current. In particular, a coil of a relay may be energized, which increases the energy stored in the magnetic circuit or coil. The current through the coil increases until a force sufficient to move an armature of the relay from the de-energized position to an energized position is obtained, i.e. the armature of the relay moves from an open position to closed position. When the armature of the relay starts to move, the energy stored in the magnetic circuit or coil decreases. This change in stored energy may be seen in the coil current as illustrated in the waveform diagrams of FIGS. 1A through 1F.

Figure 1B:
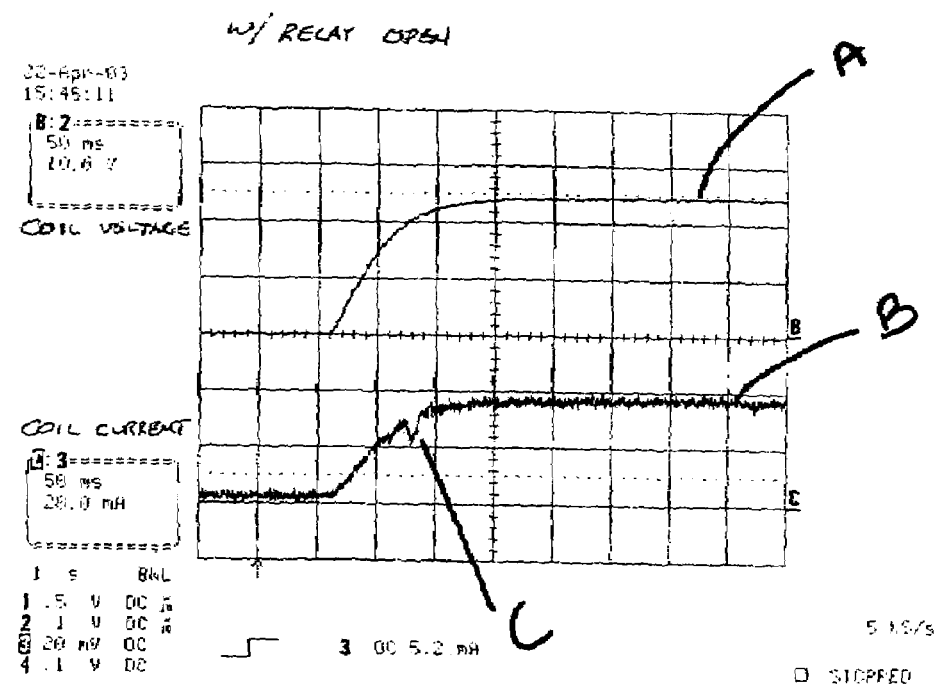

Referring now to FIGS. 1A through 1F, waveform diagrams of coil currents and voltages of relays according to embodiments of the present invention will be discussed. The upper waveform A refers to the coil voltage and the lower waveform B refers to the coil current in FIGS. 1A through 1F. FIG. 1A illustrates a coil voltage waveform A and a coil current waveform B of an energized coil associated with a relay. The armature of the relay does not move when the coil is energized, therefore, no change in the current waveform B is illustrated in FIG. 1A. FIG. 1B illustrates a coil voltage waveform A and a coil current waveform B of an energized coil where the armature moves from a de-energized position to an energized position. As illustrated in FIG. 1B, a change in the coil current C is illustrated in the coil current waveform B.

Figure 1C:
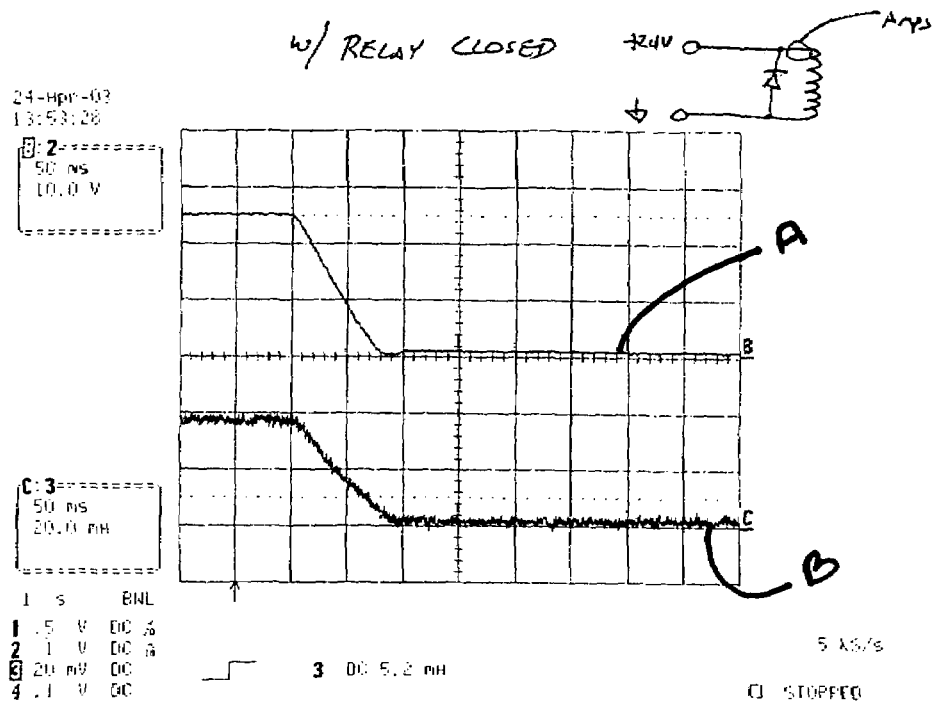
Figure 1D:
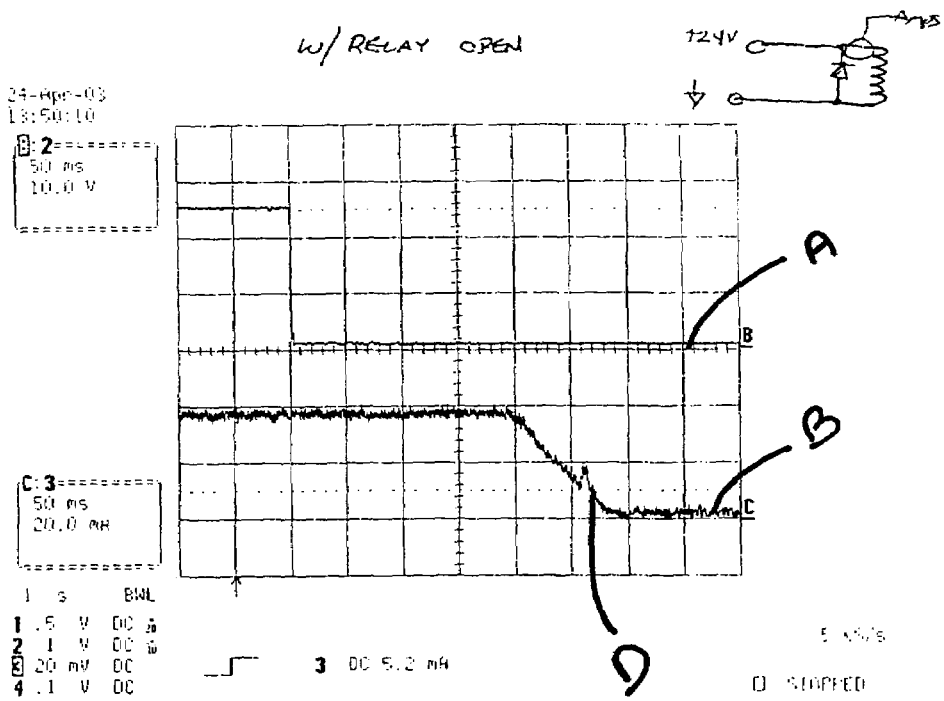

FIG. 1C illustrates a coil voltage waveform A and a coil current waveform B of a de-energized coil. The relay in this example has been placed in parallel with a diode. The armature of the relay does not move when the coil is de-energized, therefore, no change in the current waveform B is illustrated in FIG. 1C. FIG. 1D illustrates a coil voltage waveform A and a coil current waveform B of a de-energized coil where the armature moves from the energized position to the de-energized position. As illustrated in FIG. 1D, a change in the coil current D is illustrated in the coil current waveform B.

Figure 1E:
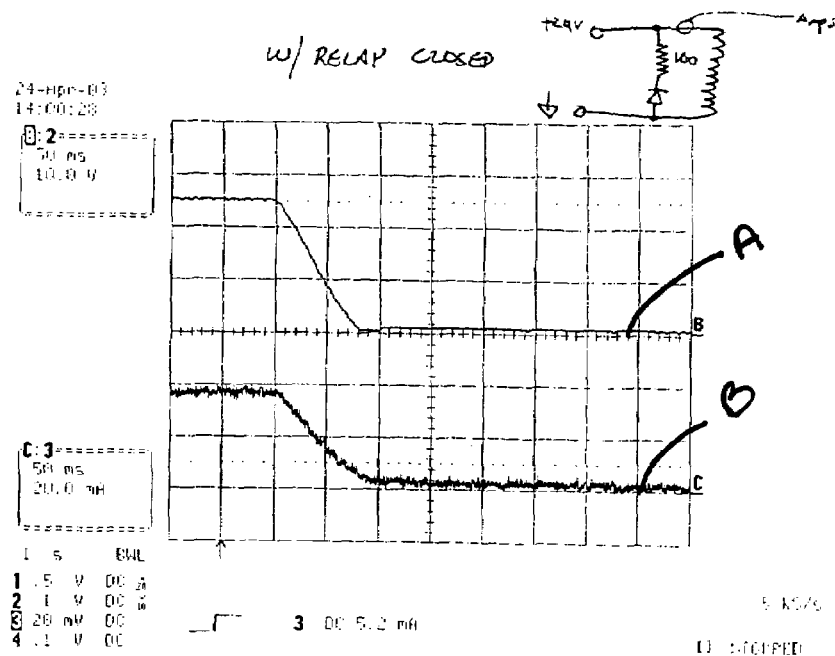
Figure 1F:
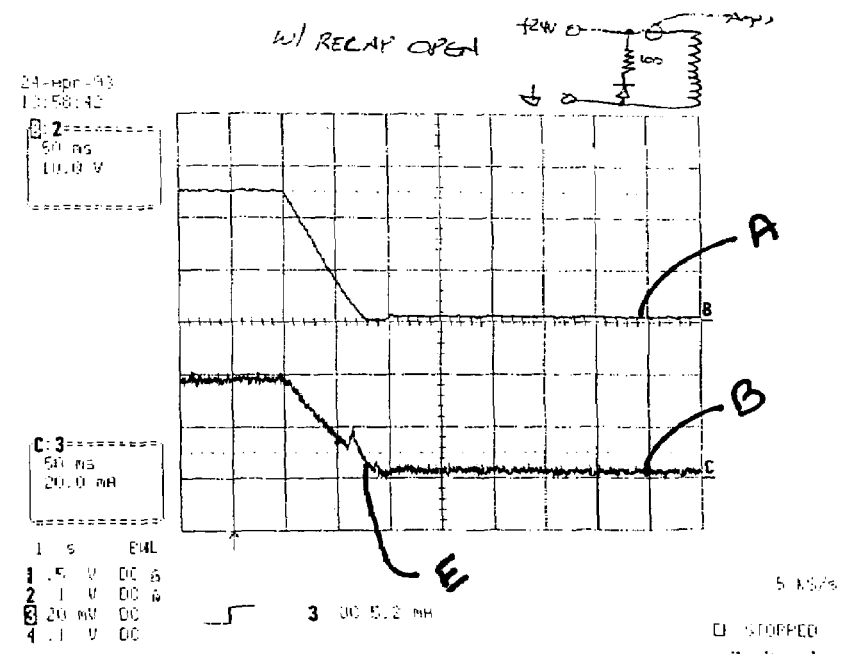

FIG. 1E illustrates a coil voltage waveform A and a coil current waveform B of a de-energized coil. The relay in this example has been placed in parallel with a resistor and a diode. The armature of the relay does not move when the coil is de-energized, therefore, no change in the current waveform B is illustrated in FIG. 1E. FIG. 1F illustrates a coil voltage waveform A and a coil current waveform B of a de-energized coil where the armature moves from the energized position to the de-energized position. As illustrated in FIG. 1F, a change in the coil current E is illustrated in the current waveform B.

Accordingly, as illustrated in FIGS. 1A through 1F, a change in the coil current occurs when the armature of the relay moves from a first position to a second position. The direction of the movement of the armature may be determined by the direction of the coil current disturbance. For example, FIG. 1B illustrates a current disturbance when the armature moves from an open position to a closed position. In contrast, FIGS. 1D and 1F illustrate current disturbances when the armature moves from a closed position to an open position. Thus, by monitoring the coil current disturbances, it may be determined if the armature of the relay moved from a first position to a second position. If the coil is de-energized and the armature does not move, the control circuit may be configured to energize and/or de-energized the relay to flex the armature of the relay until the armature releases. Thus, the likelihood of cross connection of two power sources may be reduced.

Figure 2:
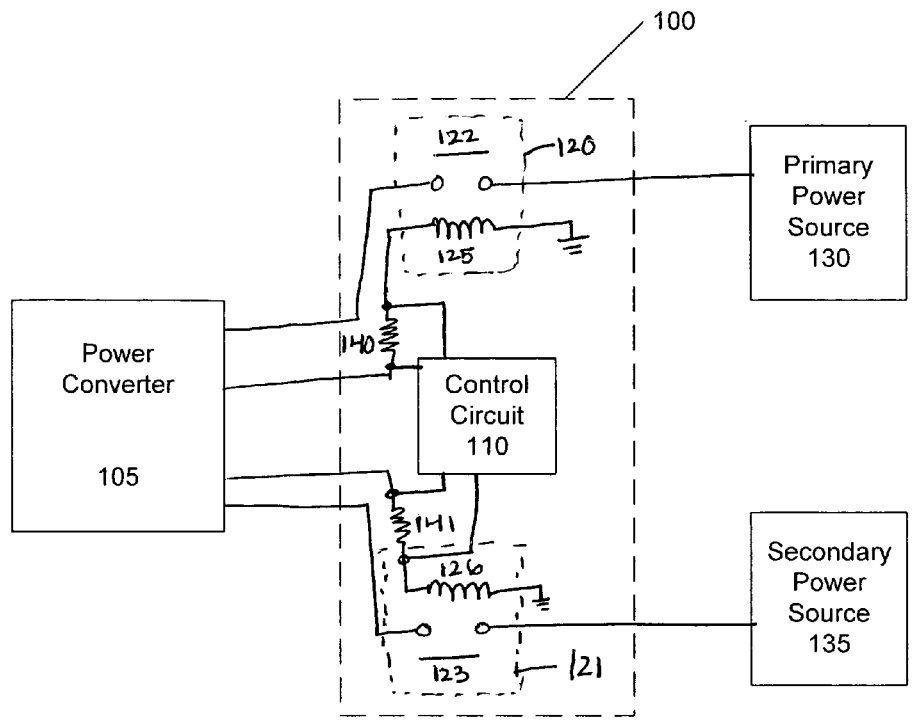
FIG. 2 is a schematic block diagram of systems including devices for detecting an operational failure of a relay according to some embodiments of the present invention.

Referring now to FIG. 2, devices for detecting the presence of an operational failure of a relay according to some embodiments of the present invention will be discussed. An apparatus 100 for coupling a power converter 105 to primary and secondary power sources 130 and 135 according to some embodiments of the present invention is illustrated in FIG. 1. As illustrated, the apparatus 100 includes first and second relays 120 and 121 including first and second corresponding armatures 122 and 123, respectively, and first and second corresponding coils 125 and 126, respectively. As illustrated, a power converter 105 may be coupled to and decoupled from a primary power source 130 and/or a secondary power source 135 via the first and second relays 120 and 121, respectively. The primary power source 130 may be, for example, a commercial utility, and the secondary power source 135 may be, for example, a battery, generator, fuel cell or the like.

In operation, a coil of a relay, for example, the first coil 125 of relay 120 or the second coil 126 of relay 121, is energized, which increases the energy stored in the magnetic circuit or coil. The current through the coil increases until a force sufficient to move the armature of the relay from the de-energized position to an energized position is obtained, for example, the armature (122 or 123) moves from an open position to closed position. When the armature of the relay starts to move, the energy stored in the magnetic circuit or coil decreases. This change in stored energy may be seen in the coil current as discussed above with respect to FIGS. 1A through 1F. Exemplary relays that may exhibit a detectable coil current pattern according to embodiments of the present invention include Song Chuan (832A-1A-F-S, 24VDC) Song Chuan (832-1A-C, 24VDC) and Omron (G7J-4A-P, 24VDC).

As illustrated, the first and second relays 120 and 121 may also be coupled to a control circuit 110. The control circuit 110 is configured to sense the coil current and to detect an operational failure of the relay therefrom. In particular, the control circuit 110 may be configured to detect a pattern indicative of the operational failure of the relay, for example, whether the first or second armature 122 and 123 of the first or second relay 120 and 121, respectively, is welded shut. Thus, when the coil is de-energized, the first or second armature 122 and 123 of the first or second relay 120 and 121 may remain closed. In some embodiments of the present invention the identified pattern may be, for example, a change in the coil current with respect to time. In embodiments of the present invention where the first or second armature 122 and 123 is welded shut, i.e., fixed in a stationary position, the control circuit 110 may be configured to energize and/or de-energize the relay (120 and 121) to flex the armature (122 and 123) of the relay until the armature of the relay releases and moves to the de-energized position.

It will be understood that the control circuit 110 may also be configured to prevent coupling of both the primary power source 130 and the secondary power source 135 to the power converter 105 at the same time to reduce the likelihood of cross connections of the two sources of power.

Referring again to FIG. 2, the current through the first and second coils may be monitored using first and second sense resistors 140 and 141, respectively. The voltage across the first and second sense resistors 140 and 141 may be provided to the control circuit 110, which may use the voltages to calculate first and second coil currents through the first and second coils 125 and 126, respectively. It will be understood that although embodiments of the present invention are illustrated herein as using resistance elements to sense the first and second coil currents through the first and second coils 125 and 126, respectively, embodiments of the present invention are not limited to this configuration. For example, other types of current sensors, such as Hall Effect current sensors, may be used to sense the currents through the first and second coils 125 and 126 without departing from the scope of the present invention.

It will be further understood that although the control circuit 110, the first and second relays 120 and 121 and the first and second sense resistors 140 and 141 are illustrated in FIG. 2 as being separate from the power converter 105, embodiments of the present invention are not limited to this configuration. For example, the control circuit 110, the first and second relays 120 and 121 and/or the first and second sense resistors 140 and 141 may be integrated with the power converter 105 without departing from the scope of the present invention.

Now referring to FIG. 3, a schematic block diagram of a system 200 for coupling a UPS 250 to primary and secondary sources 230 and 235 including devices for detecting an operational failure of a relay according to some embodiments of the present invention will be discussed. As illustrated, the UPS 250 includes a control circuit 210 integrated therein. It will be understood that the control circuit 210 may be separate from the UPS 250 without departing from the scope of the present invention. The UPS 250 is a device that allows equipment plugged into, for example, a power outlet to keep running for at least a short time when the primary power source 230 is lost. The UPS 250 may also provide for protection from power surges.

The system 200 includes first and second relays 220 and 221. The first and second relays include first and second corresponding coils 225 and 226, respectively, and first and second corresponding armatures 222 and 223, respectively. As illustrated, the UPS 250 may be coupled to and decoupled from the primary power source 230 and the secondary power source 235 via the first and second relays 220 and 221, respectively. As discussed above with respect to FIG. 3, the change in stored energy may be exhibited in first and second coil currents corresponding to the first and second coils 225 and 226, respectively. The control circuit 210 is configured to sense the coil current and detect an operational failure of the relay therefrom. In particular, in some embodiments of the present invention the control circuit 210 may be configured to detect a pattern indicative of the operational failure of the relay, for example, whether the first and/or second armature 222 and 223 of the first and/or second relay 220 and 221 is welded shut. If the control circuit 210 detects an operational failure, the control circuit 210 may prevent both the primary power source 230 and the secondary power source 235 from being coupled to the UPS 250 at the same time to reduce the likelihood of cross connection of the primary and secondary power sources 230 and 235 to a single UPS 250. Furthermore, if the control circuit 210 detects an operational failure of the relay, the control circuit 210 may be further configured to energize and/or de-energize the relay to flex the armature (222 and 223) to break the weld.

Figure 3:
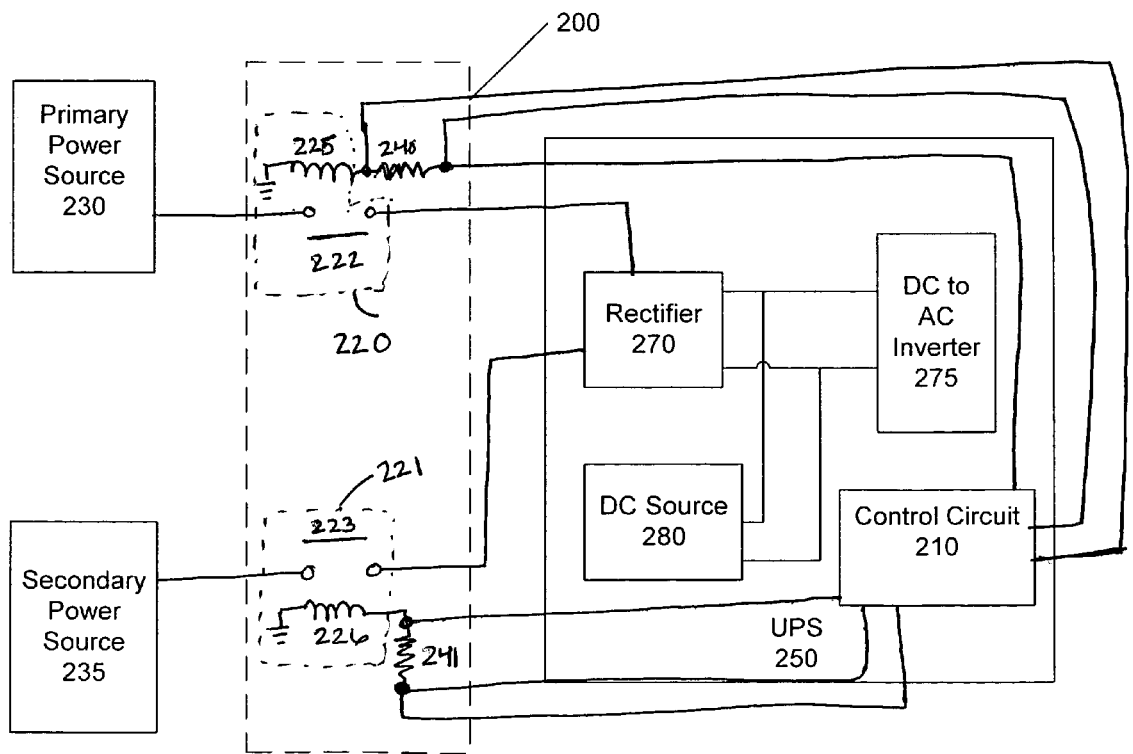
FIG. 3 is a schematic block diagram of systems including UPSs having control circuits configured to detect an operational failure of a relay according to further embodiments of the present invention.

As further illustrated in FIG. 3, the current through the first and second coils 225 and 226 may be monitored using first and second sense resistors 240 and 241, respectively. The voltage across the first and second sense resistors 240 and 241 may be provided to the control circuit 210, which may use the voltages to calculate the first and second coil currents through the first and second coils 225 and 226, respectively. It will be understood that although embodiments of the present invention are illustrated herein as using resistance elements to sense the first and second coil current through the first and second coils 225 and 226, respectively, embodiments of the present invention are not limited to this configuration. For example, other types of current sensors, such as Hall Effect current sensors, may be used to sense the currents through the first and second coils 225 and 226 without departing from the scope of the present invention.

As further illustrated in FIG. 3, an on-line UPS 250 may include a rectifier circuit 270 for providing direct current (DC) voltage from the alternating current (AC) power distribution network, i.e. the primary power source 230 such as a utility and/or the secondary power source 235 such as a generator. An inverter 275 is also provided for converting (inverting) the DC voltage back to an AC voltage for delivery to the power distribution network. As further illustrated, UPSs may further include a DC source 280, for example, a battery. A battery connection circuit (not shown) may also be included to connect the battery power to the input of the DC to AC inverter 280, so that when reliable AC power is lost the delivery of AC power to the power distribution network is substantially unaffected. It will be understood that while FIG. 3 illustrates an on-line UPS, embodiments of the present invention may also be used with and/or in other types of UPSs, including, for example, standby and line interactive UPSs.

In some embodiments of the present invention, the UPS 250 may be inserted between the primary power source 230, such as a commercial utility, and the primary power source of equipment to be protected, for example, a mainframe computer or a respirator in a hospital. In the event of an interruption in the primary power, the DC source (battery) 280 may take over without losing a fraction of a cycle in the AC output of the UPS. The battery 280 may also provide protection against transients. The duration of the longest outage for which protection is ensured depends on the battery capacity, and to a certain degree, on the rate at which the battery is drained. As discussed above, certain UPS systems may include secondary power sources 235 such as generators, which may provide an extended source of secondary power.

It will be further understood that although the first and second relays 220 and 221 and the first and second sense resistors 240 and 241 are illustrated in FIG. 3 as being separate from the UPS 250, embodiments of the present invention are not limited to this configuration. For example, the first and second relays 220 and 221 and/or the first and second sense resistors 240 and 241 may be integrated with the UPS 250 without departing from the scope of the present invention.

Figure 4:
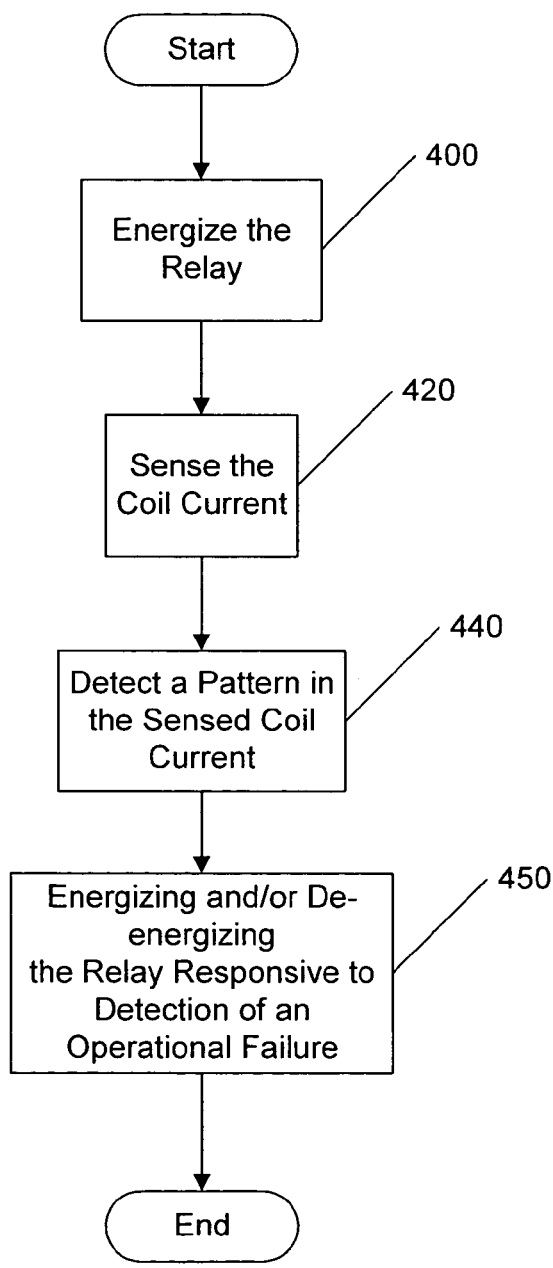
FIG. 4 is a flowchart illustrating exemplary operations of systems including devices for detecting an operational failure of a relay according to some embodiments of the invention.

Operations of devices for detecting an operational failure of a relay according to some embodiments of the present invention will be discussed. Referring now to FIG. 4, operations begin at block 400 by energizing a relay. The relay may be energized to couple and decouple a power source to and from a UPS or may be energized to test the functionality of the relay without departing from the scope of the present invention. A current through a coil of the relay may be sensed (block 420). A pattern may be detected in the sensed coil current (block 440) that indicates an operational failure of an armature of the relay, for example, if the armature is fixed in a stationary position, i.e. has not moved. The relay may be energized and/or de-energized to flex the armature of the relay (block 450) responsive to detection of the operational failure of the armature of the relay. In other words, flexing the armature of the relay may possibly break the weld. The pattern may include a change in the coil current with respect to time as illustrated in FIGS. 1B, 1D and 1F. In some embodiments of the present invention the relay may be configured to couple and decouple a power source to and from an input of a power conversion circuit of a UPS.

Figure 5:
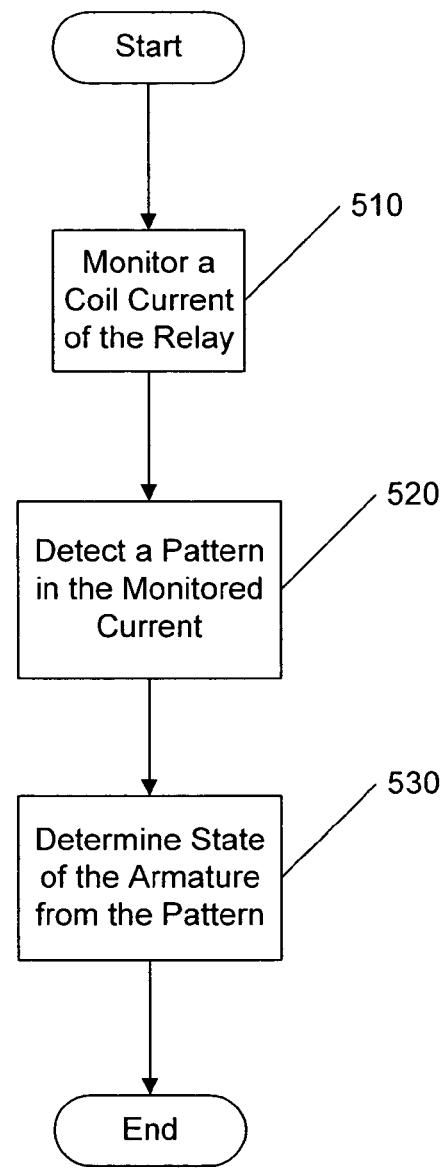
FIG. 5 is a flowchart illustrating exemplary operations of systems including devices for detecting an operational failure of a relay according to further embodiments of the invention.

Referring now to FIG. 5, operations begin at block 510 by monitoring a coil current through a coil of a relay. A pattern may be detected in the monitored coil current (block 520). The pattern may indicate an operational failure of the armature of the relay. A state of the armature may be determined from the pattern (block 530). The pattern may be, for example, a change in current with respect to time.

Figure 6:
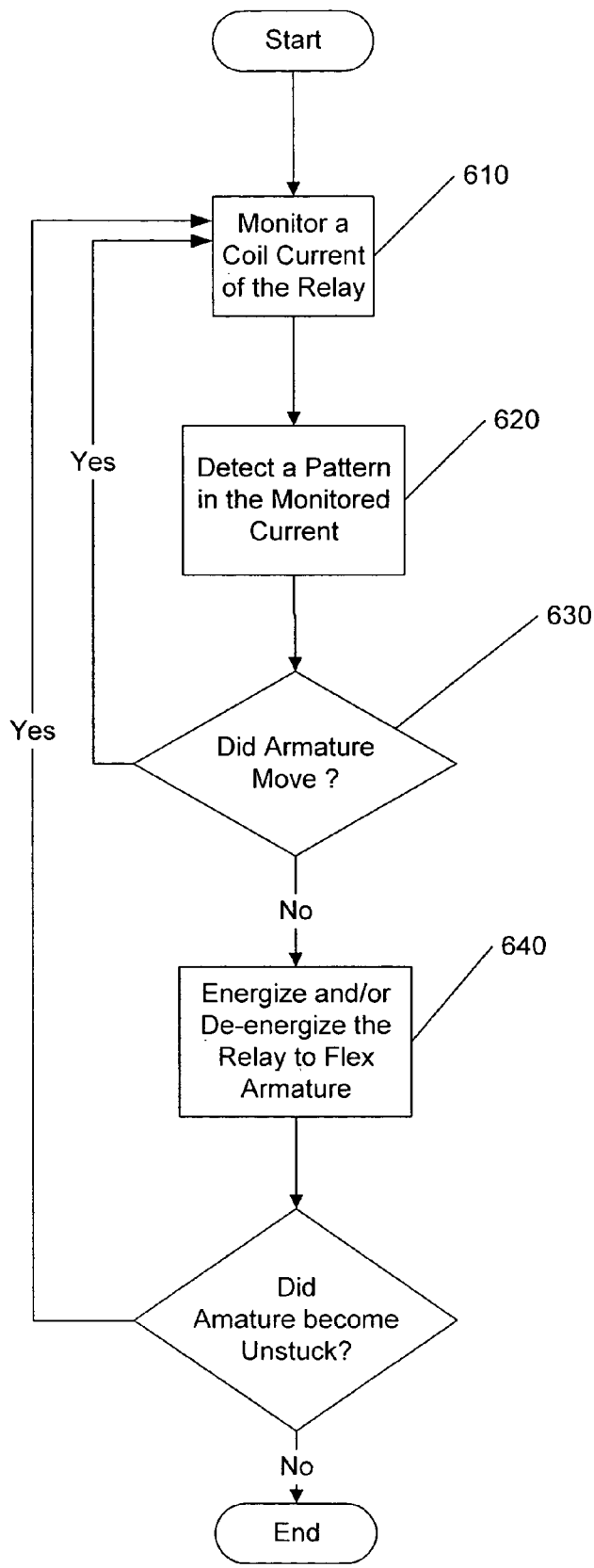
FIG. 6 is a flowchart illustrating exemplary operations of systems including devices for detecting an operational failure of a relay according to still further embodiments of the invention.
Figure 1A:
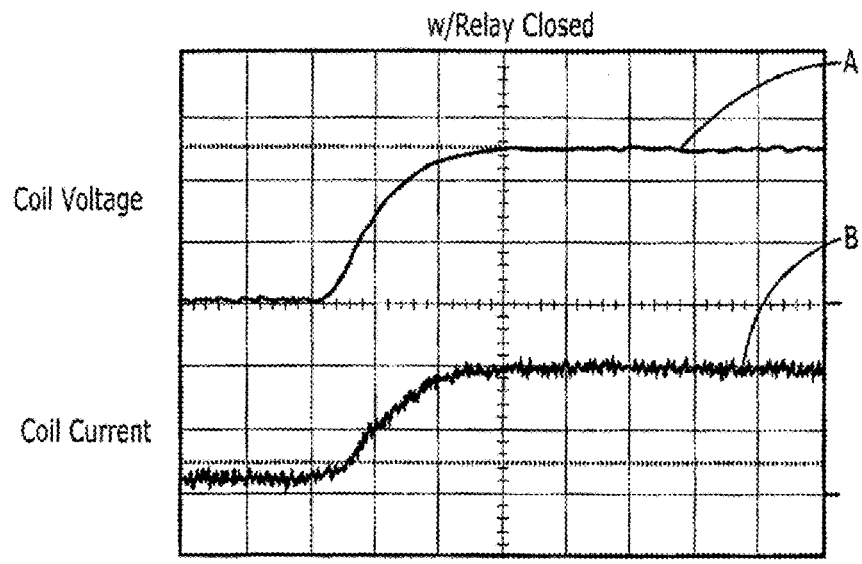
Figure 1B:
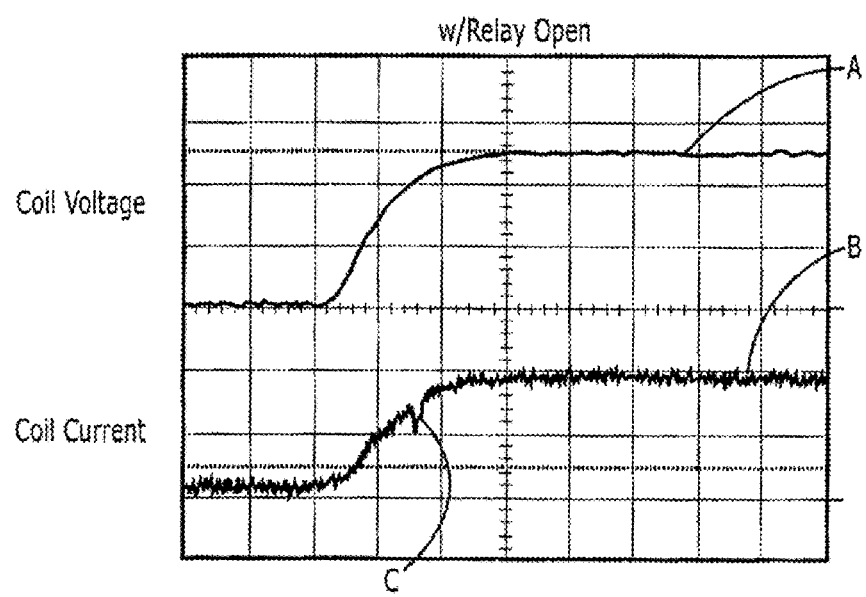
Figure 1C:
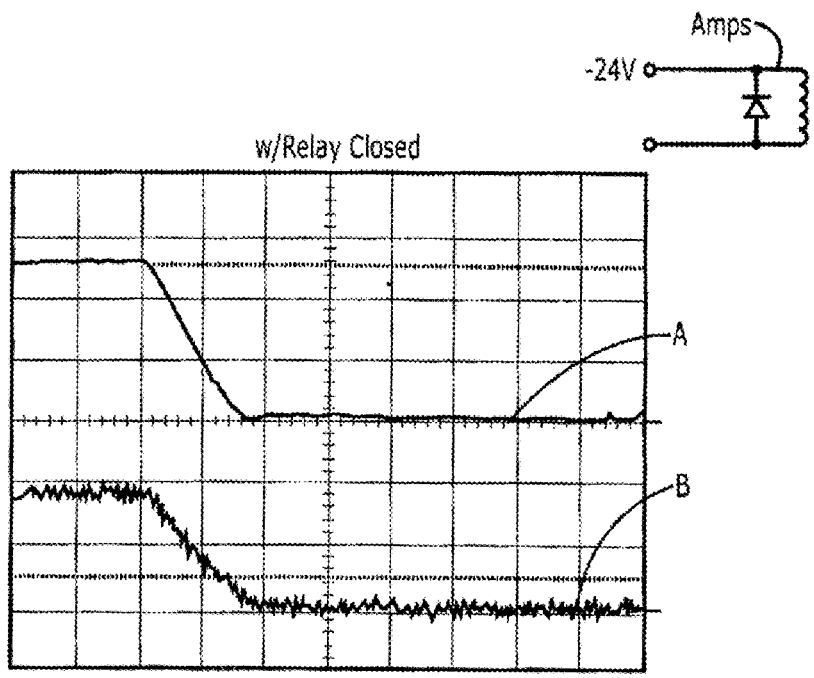
Figure 1D:
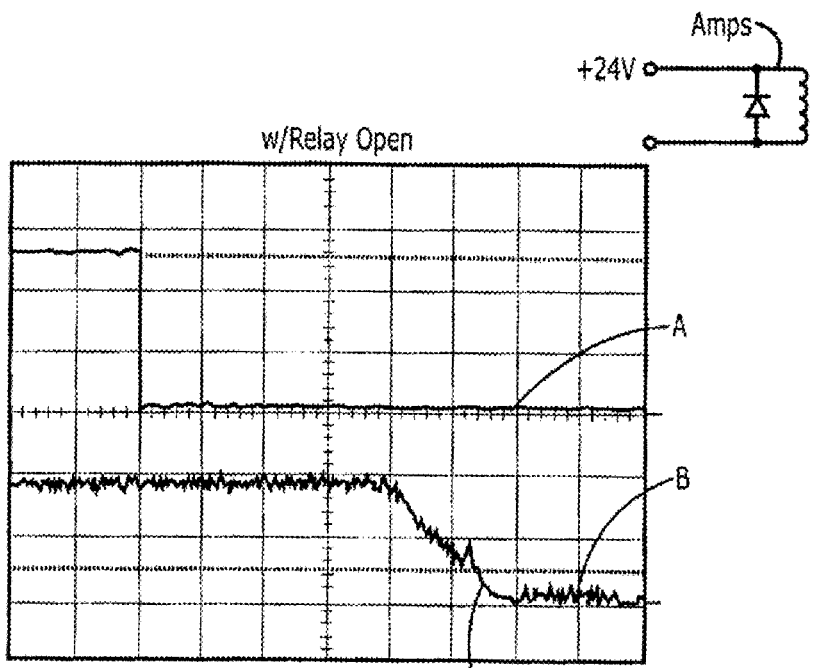
Figure 1E:
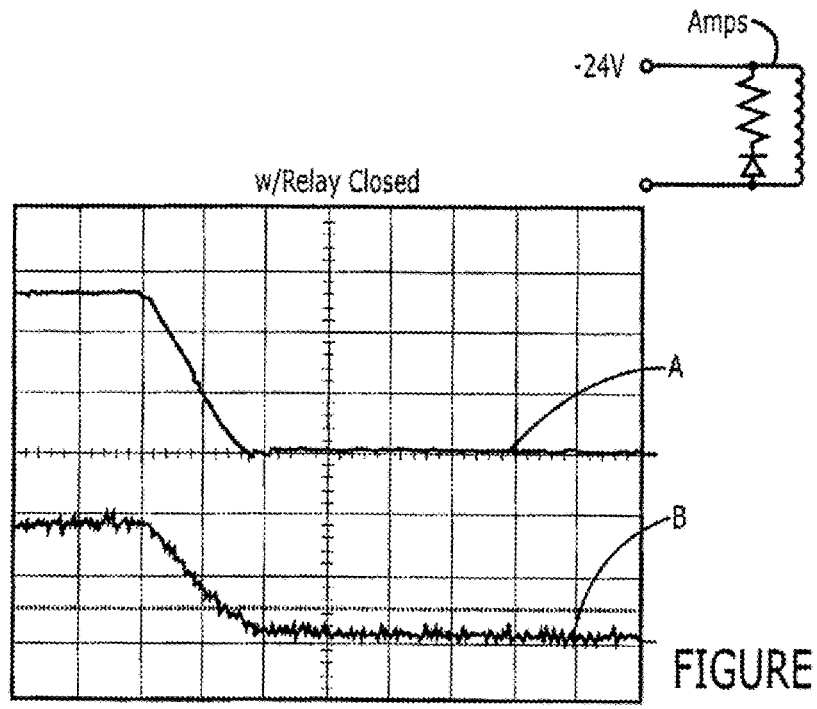
Figure 1F:
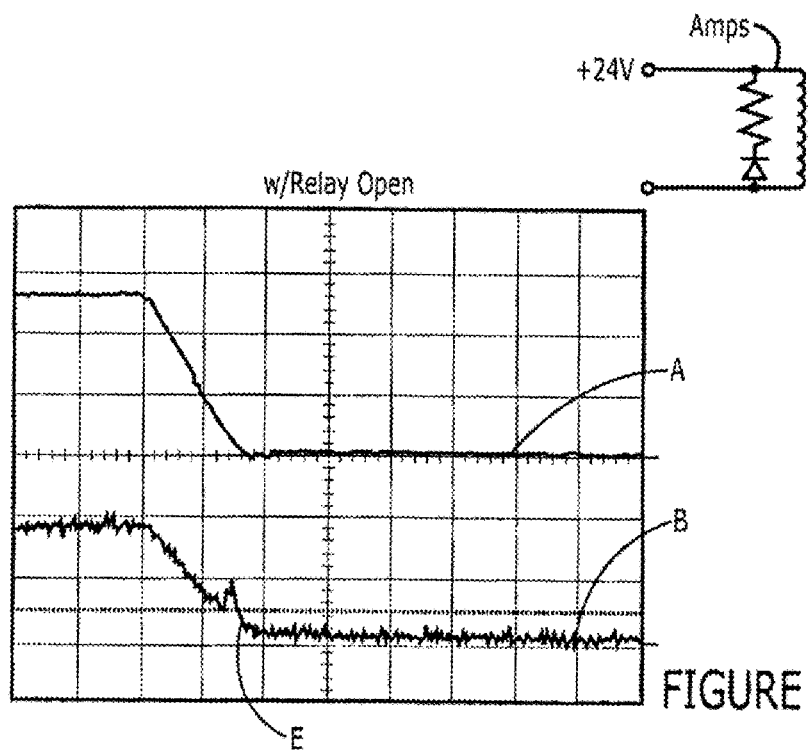
Figure 2:
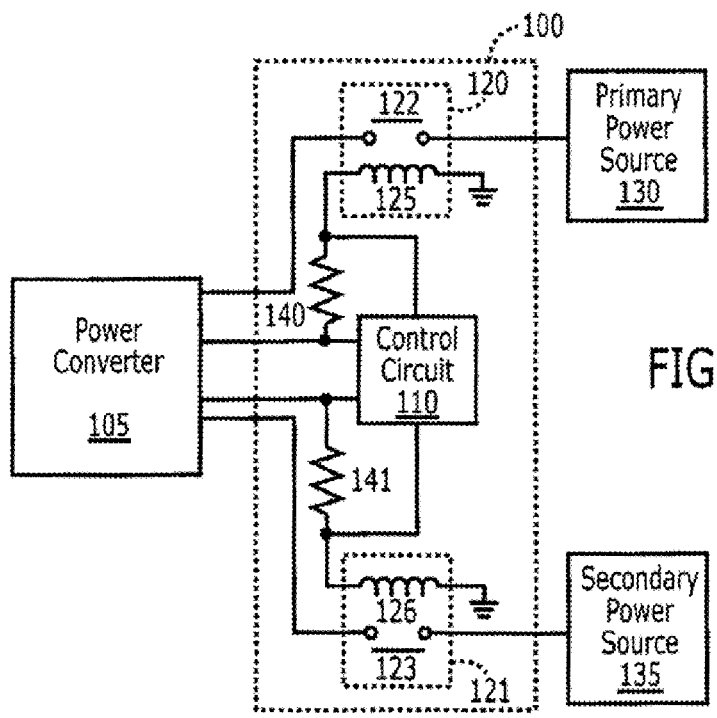
Figure 3:
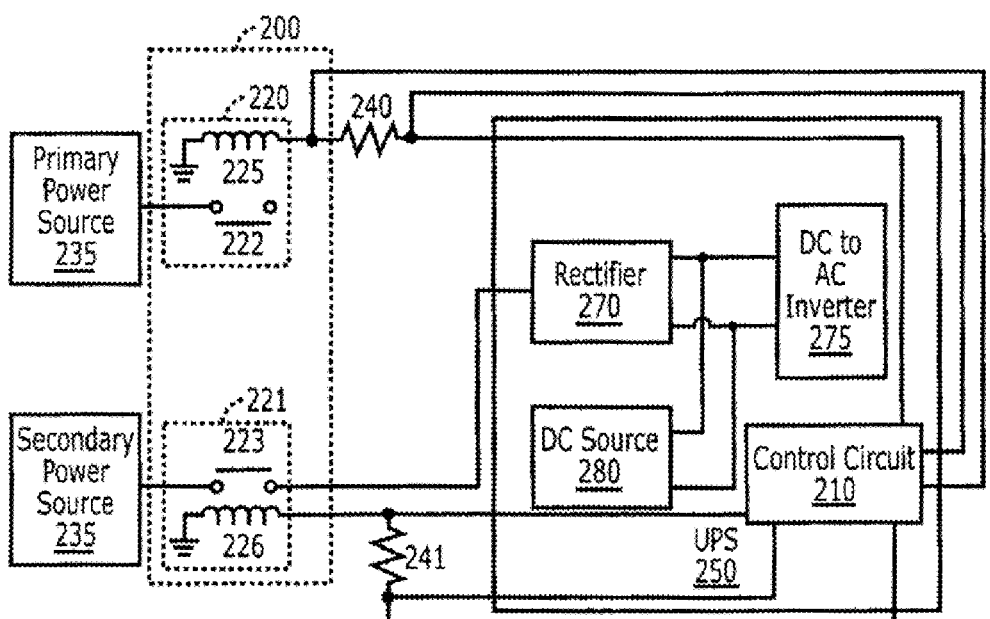
Figure 4:
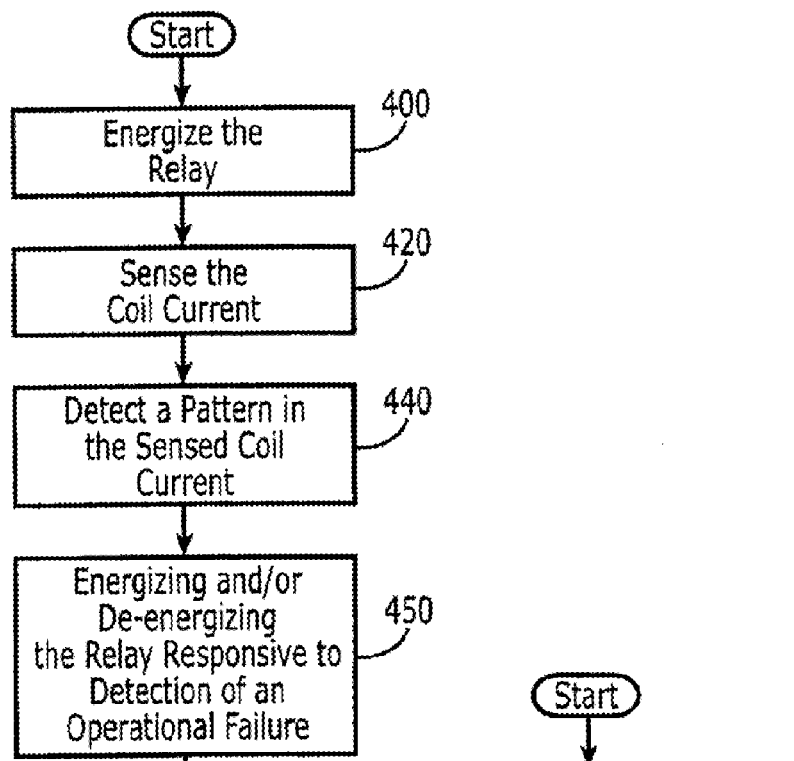
Figure 5:
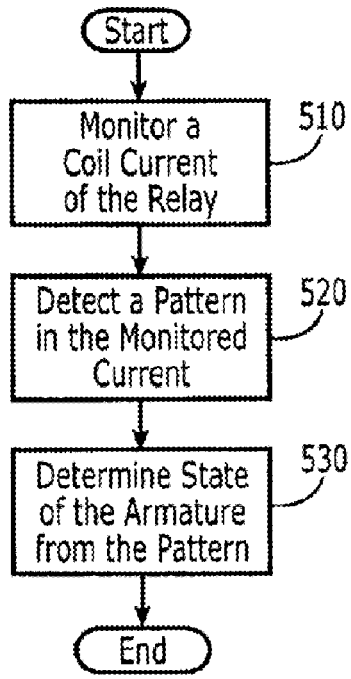
Figure 6:
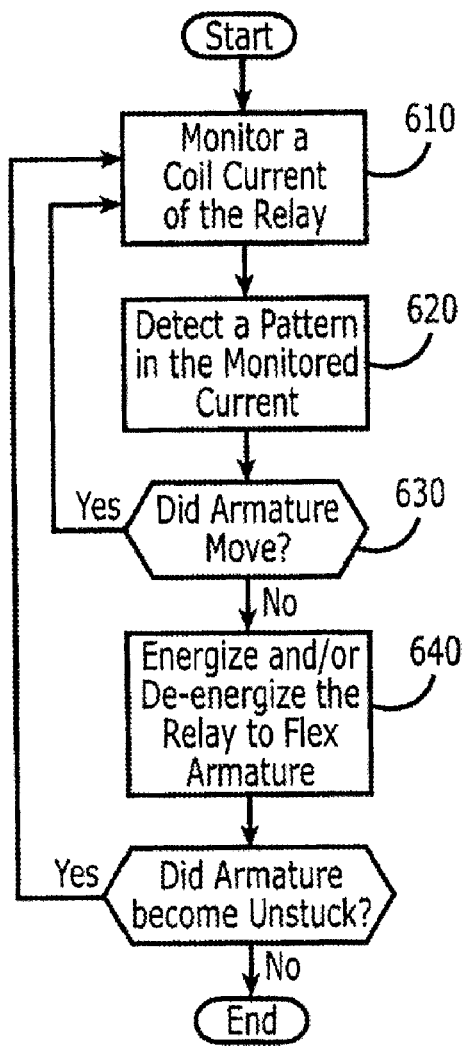

Referring now to FIG. 6, operations begin at block 610 by monitoring a coil current through a coil of a relay. A pattern may be detected in the monitored coil current (block 620). The pattern may indicate an operational failure of the armature of the relay, for example, the armature may be fixed in a stationary position. It is determined if the armature of the relay has moved (block 630). If it is determined that the armature has moved (block 630), operations return to block 610 and repeat. If, on the other hand, it is determined that the armature has not moved, the relay may be energized and/or de-energized to flex the armature of the relay to possibly break the weld (block 640). It is determined if the weld is broken (block 650). If the weld is broken, operations may return to block 610 and repeat. In certain embodiments of the present invention, the pattern comprises a change in the coil current with respect to time.

As briefly discussed above with respect to FIGS. 1A through 6, embodiments of the present invention provide a control circuit operatively associated with a relay. The control circuit may be configured to monitor a current through a coil of the relay to identify a pattern indicating an operational failure of the relay. Once an operational failure is detected, the control circuit may prevent a second source of power from being coupled to the UPS to reduce the likelihood of cross connection of two sources of power to a single UPS. In some embodiments of the present invention, the control circuit may be further configured to energize and/or de-energize the relay until the operation failure is removed.

In the drawings and specification, there have been disclosed exemplary embodiments of the invention. Although specific terms are employed, they are used in a generic and descriptive sense only and not for purposes of limitation, the scope of the invention being defined by the following claims.

That which is claimed:

1. A method of determining a state of a relay in an uninterruptible power supply (UPS), comprising:
    energizing the relay, the relay being configured to couple and decouple a power source to and from an input of a power conversion circuit of the UPS;
    sensing a coil current through a coil of the relay; and
    detecting a pattern in the sensed coil current indicating an operational failure of an armature of the relay.

2. The method of claim 1 wherein the detected pattern comprises a change in the coil current with respect to time.

3. The method of claim 1, further comprising energizing and/or de-energizing the relay responsive to detection of the operational failure of the relay to flex the armature of the relay.

4. A method of determining a state of a relay in an uninterruptible power supply (UPS), comprising:
    monitoring a coil current through a coil associated with the relay, the relay being configured to couple and decouple a power source to and from an input of a power conversion circuit of the UPS;
    detecting a pattern in the monitored coil current indicating an operational failure of an armature of the relay; and
    determining the state of the armature from the detected pattern.

5. The method of claim 4 wherein determining the state of the armature comprises detecting movement of the armature.

6. The method of claim 5, further comprising energizing and/or de-energizing the relay to flex the armature of the relay if it is determined that the armature is fixed in a stationary position.

7. The method of claim 4 wherein the pattern comprises a change in the coil current with respect to time.

8. A device comprising:
    a relay including a coil and an armature, the relay being configured to couple and decouple a power source to and from an input of a power conversion circuit of an uninterruptible power supply (UPS); and
    a control circuit configured to sense a current in the coil of the relay and to detect a pattern indicating a state of the armature of the relay from the sensed current.

9. The device of claim 8 wherein the control circuit is further configured to detect movement of the armature.

10. The device of claim 9 wherein the control circuit is further configured to energized and/or de-energize the relay to flex the a mature if the armature is fixed in a stationary position.

11. The device of claim 8 wherein the pattern comprises a change in the coil current with respect to time.

12. The device of claim 8 further comprising a current sensor configured to sense the coil current.

13. The device of claim 12 wherein the current sensor comprises at least one of a resistance element and a Hall Effect current sensor.

* * * * *

UNITED STATES PATENT AND TRADEMARK OFFICE
CERTIFICATE OF CORRECTION

PATENT NO. : 7,403,368 B2
APPLICATION NO. : 10/861620
DATED : July 22, 2008
INVENTOR(S) : Johnson, Jr.

It is certified that error appears in the above-identified patent and that said Letters Patent is hereby corrected as shown below:

On the Title Page, illustrative figure should be deleted and substituted therefore the attached title page.

<u>In the Drawings:</u>
Please replace the 6 pages of informal drawings with the attached 6 pages of formal drawings as shown on the attached pages.

Column 8, Claim 10, Line 52: Please correct "a mature"
                                To read -- armature --

Signed and Sealed this

Eighteenth Day of November, 2008

JON W. DUDAS
*Director of the United States Patent and Trademark Office*

United States Patent
Johnson, Jr.

(10) Patent No.: US 7,403,368 B2
(45) Date of Patent: Jul. 22, 2008

(54) DEVICES AND METHODS FOR DETECTING OPERATIONAL FAILURES OF RELAYS

(75) Inventor: Robert W. Johnson, Jr., Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 469 days.

(21) Appl. No.: 10/861,620

(22) Filed: Jun. 4, 2004

(65) Prior Publication Data

US 2005/0270720 A1 Dec. 8, 2005

(51) Int. Cl.
H01H 47/00 (2006.01)
(52) U.S. Cl. ................. 361/157; 361/160
(58) Field of Classification Search ............... 361/160, 361/157
See application file for complete search history.

(56) References Cited

U.S. PATENT DOCUMENTS 6,226,167 B1 * 5/2001 Chmiel ................. 361/160

FOREIGN PATENT DOCUMENTS

EP 0 558 190 A1 9/1993

OTHER PUBLICATIONS

International Preliminary Report on Patentability, PCT/IB2005/001566, Jun. 14, 2006.

* cited by examiner

*Primary Examiner*—Stephen W. Jackson
(74) *Attorney, Agent, or Firm*—Myers Bigel Sibley & Sajovec

(57) ABSTRACT

An uninterruptible power supply (UPS) includes a power conversion circuit and a relay. The relay is configured to couple and decouple a power source to and from an input of the power conversion circuit. The control circuit is operative to apply a coil current to the relay to sense the coil current and to detect an operational failure of the relay from the sensed coil current. Related methods of operating such UPSs are also provided.

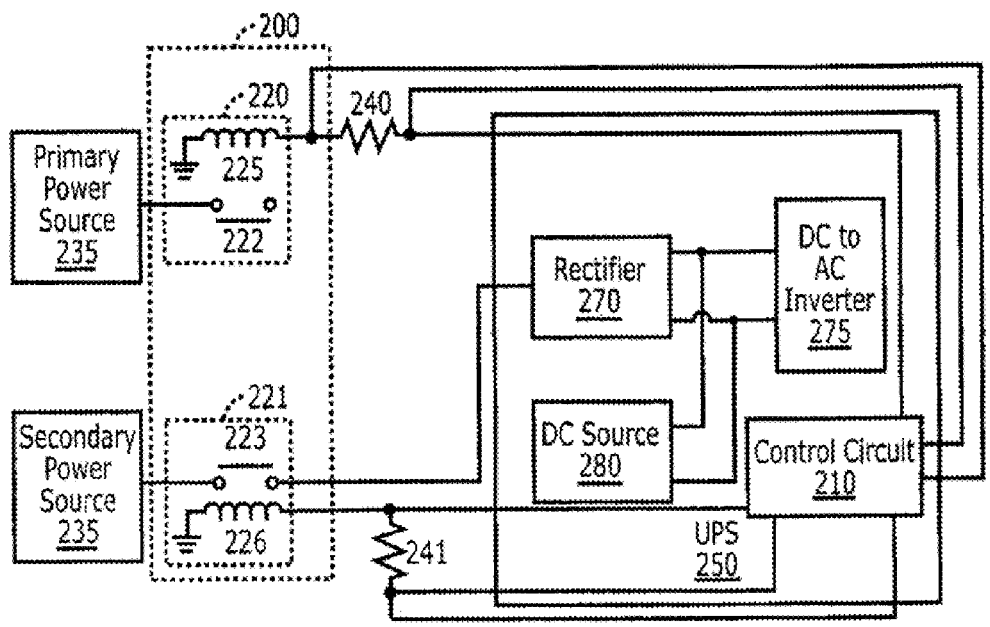

13 Claims, 6 Drawing Sheets